United States Patent
Ladd et al.

(10) Patent No.: US 9,105,542 B2
(45) Date of Patent: Aug. 11, 2015

(54) IMAGING SYSTEMS AND METHODS FOR PROVIDING A SWITCHABLE IMPEDANCE TO GROUND

(75) Inventors: John Ladd, San Jose, CA (US); Satyadev Nagaraja, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 562 days.

(21) Appl. No.: 12/907,457

(22) Filed: Oct. 19, 2010

(65) Prior Publication Data

US 2012/0092532 A1    Apr. 19, 2012

(51) Int. Cl.
- *H04N 5/217* (2011.01)
- *H04N 3/15* (2006.01)
- *H01L 27/146* (2006.01)
- *H04N 5/232* (2006.01)
- *H04N 5/272* (2006.01)

(52) U.S. Cl.
CPC ........ *H01L 27/1463* (2013.01); *H04N 5/23219* (2013.01); *H04N 5/272* (2013.01)

(58) Field of Classification Search
CPC ................... H01L 2924/00; H01L 2924/0002; H01L 2924/00014; H01L 24/81; H01L 2224/05552; H01L 2924/3011; H01L 27/14609; H01L 27/1463; H04N 5/23219; H04N 5/272
USPC .................. 348/241, 243, 248, 251, 257, 533
See application file for complete search history.

(56) References Cited

U.S. PATENT DOCUMENTS

| | | | | |
|---|---|---|---|---|
| 5,920,345 | A * | 7/1999 | Sauer | 348/308 |
| 6,798,453 | B1 * | 9/2004 | Kaifu | 348/304 |
| 8,072,525 | B1 * | 12/2011 | Ackland et al. | 348/308 |
| 2006/0203123 | A1 * | 9/2006 | Kasai | 348/372 |
| 2006/0249657 | A1 * | 11/2006 | O'Grady | 250/214 R |
| 2008/0265295 | A1 * | 10/2008 | Brady | 257/291 |
| 2010/0252717 | A1 * | 10/2010 | Dupont et al. | 250/208.1 |
| 2011/0215957 | A1 * | 9/2011 | Hummerston et al. | 341/155 |

* cited by examiner

*Primary Examiner* — Twyler Haskins
*Assistant Examiner* — Carramah J Quiett
(74) *Attorney, Agent, or Firm* — Robert F. Hightower

(57) ABSTRACT

This is generally directed to a switchable impedance to ground. In particular, a pixel array can be coupled to and surrounded by a ground ring. The ground ring can be coupled to a switchable impedance to ground. During a correlated double sampling ("CDS") phase of the pixel array, the switchable impedance can be set to a high resistance value. For example, the switchable impedance can be set to 500 ohms. During an analog-to-digital conversion ("ADC") readout phase of the pixel array, however, the switchable impedance can be set to a low resistance value. For example, the switchable impedance can be set to 1-10 ohms. Setting the switchable impedance to the high impedance value during the CDS phase can prevent imaging errors such as black hole artifacts. Setting the switchable impedance to the low impedance value during the ADC readout phase can, for example, prevent errors due to ground drift.

20 Claims, 11 Drawing Sheets

IMAGING SYSTEMS AND METHODS FOR PROVIDING A SWITCHABLE IMPEDANCE TO GROUND

FIELD OF THE INVENTION

The present invention relates to providing a switchable impedance to ground. In particular, a switchable impedance to ground can be used in place of a ground line in imaging systems, resulting in the reduction and/or elimination of various imaging system artifacts.

BACKGROUND OF THE INVENTION

Imaging systems today often include a focal plane array of pixel cells. Each of the pixel cells of this array are operable to sense an amount of light that impinges onto the pixel cell. For example, photosensitive elements such as photodiodes, photogates, photoconductors, and the like can be included in each pixel cell for accumulating an amount of charge based on the sensed light. In addition to such photosensitive elements, each pixel cell can include a charge storage region for storing the accumulated charge, a transfer transistor for transferring the accumulated charge to the charge storage region, a reset transistor for resetting the value of the pixel cell, a row select transistor for selecting a pixel cell's row, and the like.

Such pixel cells, however, can be affected by various artifacts or errors that can result in inaccuracies of the sensed light. As one example, due to variations between the transistors or other components of the pixel cells, each pixel cell may output a different signal than the other pixels cells, even when the entire pixel array is exposed to the same amount of light and circumstances. Accordingly, various techniques or designs can be utilized to reduce or eliminate such pixel array artifacts.

DETAILED DESCRIPTION OF THE INVENTION

Discussed herein are systems and methods for providing a switchable impedance to ground. In particular, in place of coupling a ground line of an imaging system to analog ground, a switchable impedance to ground can be provided. For example, the switchable impedance can switch between a relatively low impedance (e.g., 1-10 ohms) to a relatively high impedance (e.g., 500 ohms) or even an open circuit. Operation of this switchable impedance may result in the reduction and/or elimination of various artifacts of the imaging system.

Figure 1:
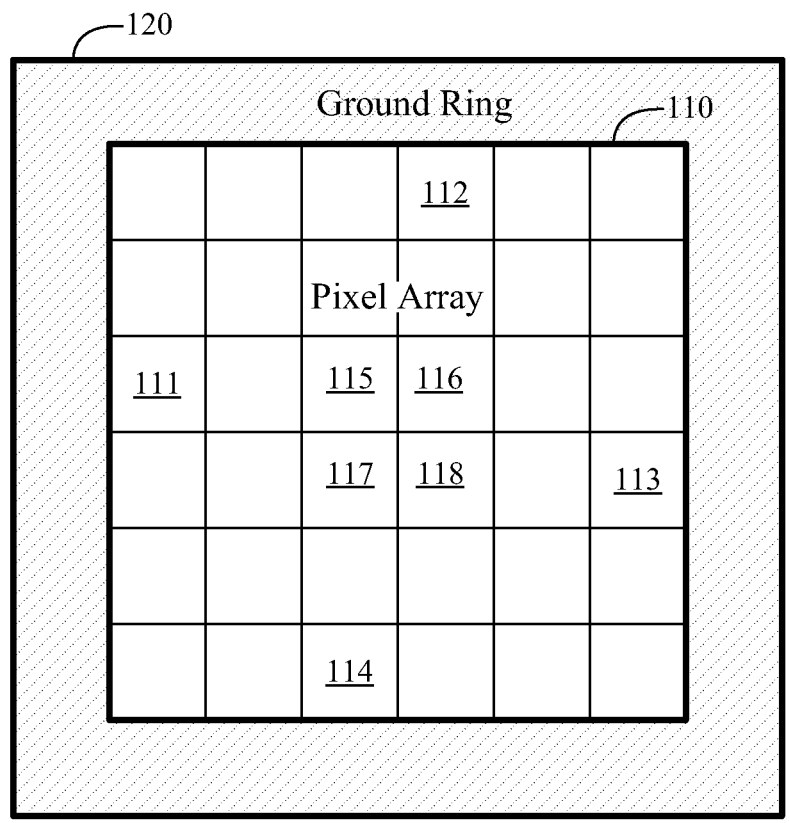
FIG. 1 shows a schematic view of an illustrative imaging system including a pixel array and ground ring in accordance with some embodiments of the invention.

Generally, an imaging system can include an array of pixel cells, where the pixels cells are arranged in a predetermined number of columns and rows. For example, FIG. 1 shows imaging system 100 that can include pixel array 110. Although a certain number of rows and columns of pixels cells is shown in FIG. 1, this is for the purpose of illustration and one skilled in the art could appreciate that pixel array 110 could alternatively include any suitable number of columns and/or rows. Naturally, pixel array 110 can include some pixel cells positioned on the edges of the array (e.g., pixel cells 111, 112, 113, and 114, and the like), some pixel cells positioned near the center of the array (e.g., pixel cells 115, 116, 117, and 118, and the like), and pixel cells anywhere else between the center and edges of pixel array 110. As will be described in greater detail below, the position of a pixel cell in the pixel array can affect the signal produced by that pixel cell, thus potentially resulting in artifacts and degradation of image quality.

In some embodiments, a ground ring can surround a pixel array, such as ground ring 120 surrounding pixel array 110. In some embodiments, ground ring 120 can be coupled directly to analog ground. However, in some embodiments and as will be described in greater detail below, ground ring 120 can be coupled to a "switchable impedance" to ground. For example, ground ring 120 can be coupled to ground through a resistance that can be selectively switched between a high impedance value and a low impedance value.

Each pixel cell of pixel array 110 can be configured to receive incident photons and convert these photons into electrical signals. For example, each pixel cell can include photosensitive elements such as photodiodes, photogates, photoconductors, and the like that can accumulate an amount of charge based on the sensed light (e.g., based on the number of incident photons) and generate an electrical signal to represent the accumulated charge.

Figure 2:
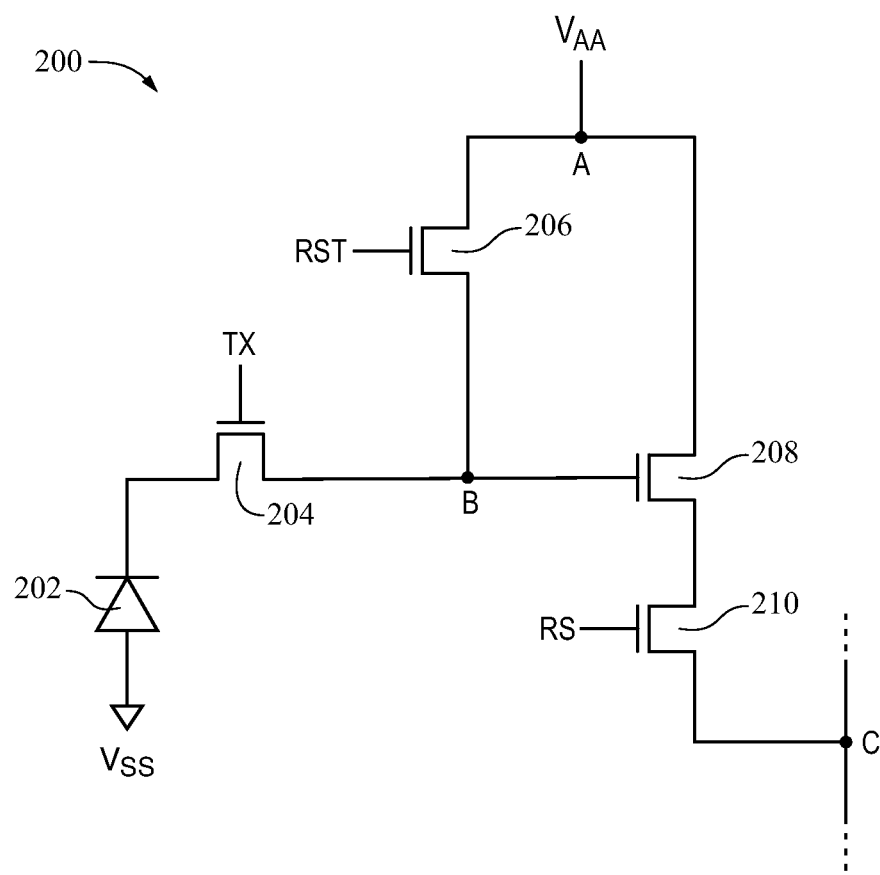
FIG. 2 shows a schematic view of an illustrative pixel cell in accordance with some embodiments of the invention.

FIG. 2 shows an illustrative schematic view of pixel cell 200. For example, pixel cell 200 could correspond to any of the pixel cells of pixel array 110 of FIG. 1. Pixel cell 200 is depicted in FIG. 2 as a 4-transistor ("4T") active pixel. However, although pixel cell 200 is depicted as such and although the disclosures herein may refer to the particular example of a 4T active pixel, this is for the purpose of illustration and not for limitation. Rather, one skilled in the art should appreciated that the present invention could alternatively or additionally be implemented with any suitable pixel design, such as, for example, a 3T active pixel, a 5T active pixel, a 6T active pixel, a charge-coupled device ("CCD") imaging system, or any other suitable pixel design or imaging system.

Pixel cell 200 can include a light sensitive element 202. For example, light sensitive element 202 is illustrated in FIG. 2 as a diode. However, light sensitive element 202 could alternatively be any suitable device for sensing light, such as photogates, photoconductors, and the like. Pixel cell 200 can also include four transistors: transfer transistor 204, reset transistor 206, source follower 208, and row select transistor 210. The conductivity of transfer transistor 204 can be controlled by the TX control signal, the conductivity of reset transistor 206 can be controlled by the RST control signal, and the conductivity of row select transistor 210 can be controlled by the RS control signal.

The amount of charge at floating diffusion region B can control the conductivity of source follower 208. The output of source follower 208 can then be presented to the remainder of the pixel array and/or the imaging system (e.g., for suitable processing) in response to row select transistor 210 being turned on. In other words, in order to read the signal value produced by pixel cell 200, pixel cell 200 can be chosen by applying the appropriate RS control signal to row select transistor 210. This, in turn, can turn on row select transistor 210, thereby allowing the signal generated by pixel cell 200 to pass to node C and proceed onwards in the system. For example, node C can couple to other pixel cells in a same row of the pixel array as pixel cell 200, to components of the imaging system for processing the signals produced by pixel cell 200, and the like.

During operation of pixel cell 200, the RS control signal may be asserted to cause row select transistor 210 to conduct, thus "choosing" pixel cell 200 for suitable processing. The value of pixel cell 200 can then be reset by turning on reset transistor 206 while transfer transistor 204 is turned off (e.g., by asserting the RST control signal while the TX control signal is not asserted). This can result in coupling the floating diffusion node B to node A, where node A is coupled to the pixel array's power (referred to herein as "$V_{AA}$"). Thus, the value of the floating diffusion node B is reset to the value $V_{AA}$. The value of pixel cell 200 is then sampled and held (e.g., by circuitry coupled to node C) by asserting a SHR command signal. This voltage level that is sampled by the SHR command signal is referred to herein as "$V_{RST}$" and can operate as a reference level for pixel cell 200.

After the $V_{RST}$ signal has been output, reset transistor 206 can be turned off (e.g., by de-asserting the RST command signal) and light sensitive element 202 can be allowed to accumulate charge for an integration period of time. This integration period can proceed during any suitable point in the operation of pixel cell 200, and is not limited to beginning after reset transistor 206 is turned off. For example, in some embodiments, the integration period can begin before and/or while reset transistor 206 is turned on and may continue after reset transistor 206 is turned off. The length of time of the integration period may, for example, be determined based on how long charge should be allowed to accumulate at light sensing element 202. In response to the integration period ending, transfer transistor 204 can be turned on by asserting the TX control signal (e.g., while reset transistor 206 is still off), thereby coupling light sensitive element 202 to floating diffusion node B. The value of pixel cell 200 can then be sampled and held (e.g., by circuitry coupled to node C) by asserting a SHS command signal. This voltage level that is sampled by the SHS command signal is referred to herein as "$V_{SIG}$" and can operate as a signal level for pixel cell 200. $V_{SIG}$ may, for example, correlate to the amount of charge accumulated by pixel cell 200.

A final output signal for pixel cell 200 can then be determined by taking the difference of the reference level and the signal level, $V_{OUT}=V_{RST}-V_{SIG}$. This method of determining an output signal for a pixel cell by taking the difference of a reference level and a signal level can be referred to as Correlated Double Sampling ("CDS"). In particular, this CDS period can include the steps of, for example, asserting the RST command signal, asserting the SHR command signal, de-asserting the RST signal, asserting the TX command signal, asserting the SHS command signal, or any combination of the above. Using CDS to obtain an output signal from a pixel cell (e.g., rather then only using $V_{SIG}$) may, for example, help to reduce some forms of fixed pattern noise within the pixel array.

Figure 3:
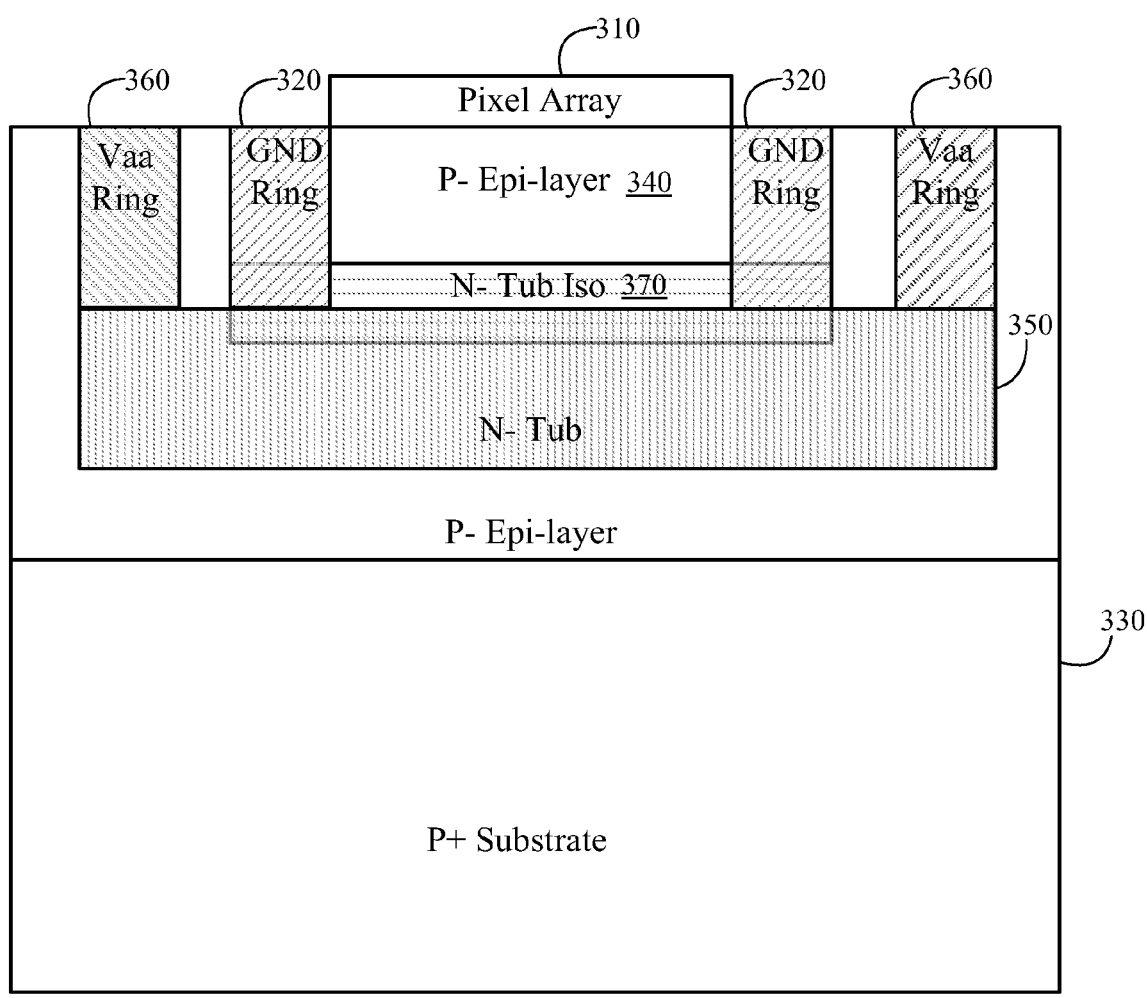
FIG. 3 shows a schematic view of an illustrative imaging system including an N-tub and pixel array in accordance with some embodiments of the invention.

FIG. 3 shows an illustrative schematic of a cross-sectional view of imaging system 300. For example, FIG. 3 can be a cross-sectional view of an imaging system including pixel array 110 of FIG. 1. Imaging system 300 can include pixel array 310 formed on substrate 330. Substrate 330 is illustrated as a p+ substrate (e.g., a p-type silicon substrate, or any other suitable p+ substrate) in FIG. 3. However, it should be understood that this is for illustration and not for limitation, and that in some embodiments an n-type substrate could alternatively be used.

As shown by FIG. 3, pixel array 310 can be positioned on top of a "floating" epitaxial layer, epi-layer 340. Epi-layer 340 can include, for example, a thin layer of p-type material that is formed on the substrate. For example, epi-layer 340 can be formed through chemical vapor deposition or through any other suitable technique. In some embodiments, including a relatively lightly doped epi-layer 340 (e.g., a p– layer) over a more heavily doped substrate 330 (e.g., a p+ substrate) can reduce latch up or other undesirable effects.

In some embodiments, epi-layer 340 can be surrounded by a positively biased n-type region positioned underneath pixel array 310 and above substrate 330. Such a positively biased n-type region can be referred to herein as an "n-tub." For example, imaging system 300 can include n-tub 350. N-tub 350 can be positively biased through V. Ring 360 that can be coupled to the pixel array power. In some embodiments, $V_{AA}$ Ring 360 can encircle a ground ring 320 that in turn can encircle pixel array 310 (e.g., ground ring 320 can encircle pixel array 310 in a manner similar to ground ring 120 of FIG. 1). In other words, the left and right instances of $V_{AA}$ Ring 360 shown in FIG. 3 can portray a left and right side, respectively, of the same $V_{AA}$ Ring. N-tub 350 can be operable to supply an electric field to collect deeply generated electrons before they can be collected by the light sensing elements of pixel array 310. Such deeply generated electrons can include, for example, electrons generated in substrate 330 or electrons that are otherwise generated below pixel array 310 and that do not correlate to light-generated electrons. Such deeply generated electrons are trapped in n-tub 350 to prevent them from penetrating into pixel array 310 and generating erroneous light-sensing result. In this manner, n-tub 350 may help prevent cross-talk and blooming issues within pixel array 310. For example, n-tub 350 may be included in imaging system have a relatively small pixel pitch (e.g., the distance between pixels of the same color), such as a pixel pitch of 2.2 micrometers or smaller.

However, due to the presence of n-tub 350, there may no longer be a low impedance path from pixel array 310 to ground through substrate 330. Accordingly, in some embodiments ground lines (not shown) can be routed through pixel array 310 and can be coupled to epi-layer 340. However, such ground lines may reduce the metal opening in the photodiode, thereby reducing the amount of pixel array 310 that is available for sensing light. Accordingly, in addition to or instead of routing ground lines through the pixel array, in some embodiments a ground ring such as ground ring 320 can be included that surrounds the pixel array. For example, ground 320 can correspond to ground ring 120 of FIG. 1. In some embodiments, ground ring 320 can be coupled to analog ground. However, in some embodiments and as will be described in greater detail below, ground ring 320 can be coupled to a "switchable ground." For example, ground ring 320 can be coupled to ground through a resistance that can be selectively switched between a high impedance value and a low impedance value.

Imaging system 300 can also include an n-tub isolation layer, n-tub iso 370 that can consist of a heavily doped p-type implant. N-tub iso 370 (i.e., the "ground layer") can be operable to, for example, supply a low resistance path to ground (e.g., through ground ring 320). However, the inherent resistance and capacitance of n-tub iso 370 can cause undesirable artifacts within the pixel array. In particular, each source follower transistor of each pixel cell (e.g., source follower 208 of FIG. 2) of pixel array 310 can include a settling time for its body. Due to the "body effect" of transistors, this body settling time may result in producing a settling time for the threshold voltage ("$V_T$ settling time") of the source follower transistor. However, due to the resistance and capacitance of the ground layer, this $V_T$ settling time may vary from pixel cell to pixel cell based on their position within the pixel array, thereby causing undesirable artifacts in pixel array 310.

Figure 4:
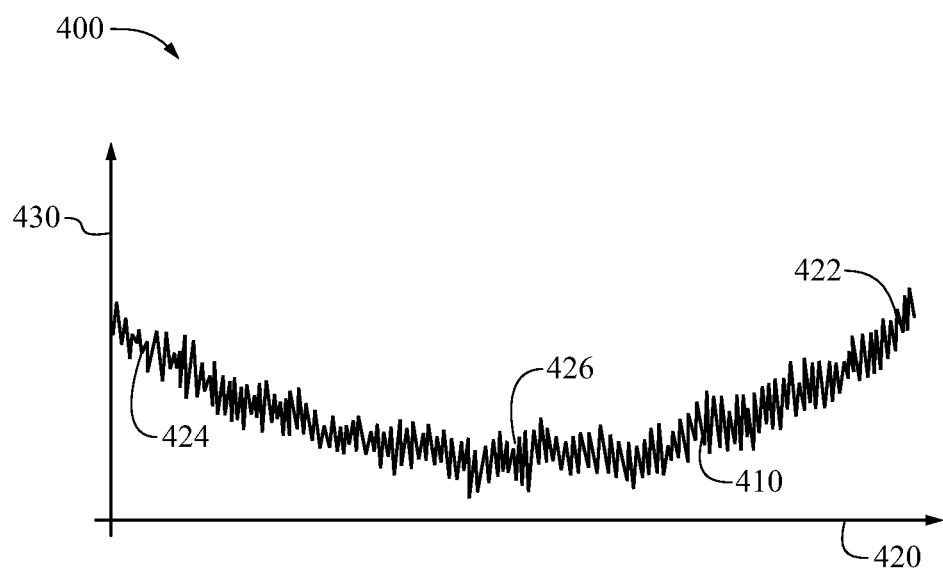
FIG. 4 shows an illustrative graph of a non-uniform dark signal in accordance with some embodiments of the invention.

As an illustration, the differences in the $V_T$ settling time can result in a non-uniformity of the "dark signal" of a pixel array. As used herein, the term "dark signal" can refer to a signal produced by the pixel array when there is no optical radiation incident on the pixel array and an operating voltage is applied. In an ideal situation, the dark signal of a pixel array is uniform across the pixel array, meaning that each pixel cell of the array outputs the same signal when no light is incident on the array. However, the differences in the $V_T$ settling time of the source followers of the pixel cells can cause the pixel array to produce a non-uniform dark signal. For example, FIG. 4 shows graph 400 of dark signal 410 that can correspond to a non-uniform dark signal. Such a non-uniform dark signal can be produced by a pixel array in which the ground layer has caused differences in the $V_T$ settling time of the source follower transistors. X-axis 420 can indicate the position in the pixel array (e.g., where location 422 and 424 can correspond to edges of the pixel array and location 426 can correspond to the center of the pixel array, and the like) and y-axis 430 can indicate the dark signal level. As shown by FIG. 4, the value of the dark signal can vary based on a pixel cell's relative position from the center of the array. As used herein, this image artifact illustrated by FIG. 4 is referred to as the "black hole" artifact.

Figure 5A:
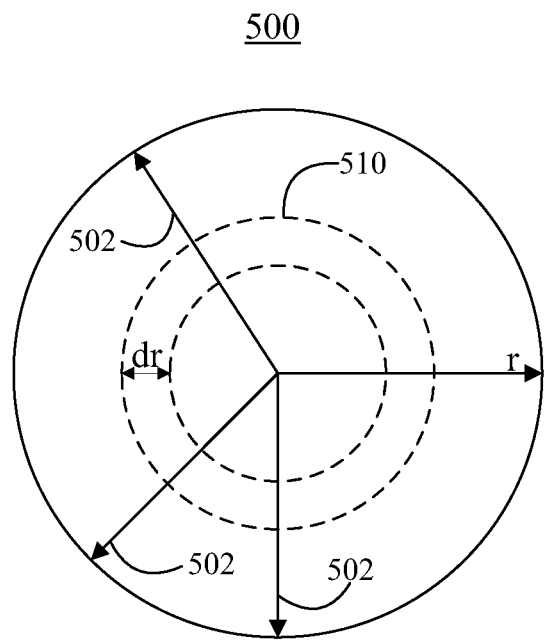
FIG. 5A shows an illustrative circular pixel array in accordance with some embodiments of the invention.
Figure 5B:
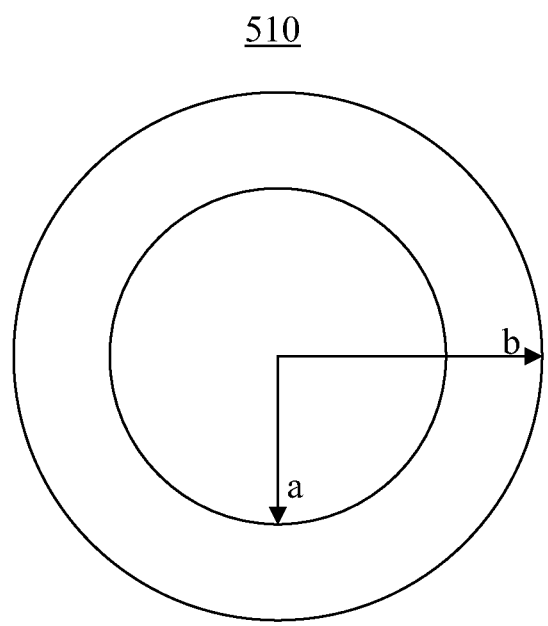
FIG. 5B shows a differential slice of a circular pixel array in accordance with some embodiments of the invention.

Since the imaging system can generate the dark signal by taking the difference between $V_{RST}$ and $V_{SIG}$, techniques such as Correlated Doubling Sample may be unable to cancel the black hole artifact. Rather, to develop a technique for effectively removing the black hole artifact, the behavior of the black hole can be considered through RC modeling. For example, as shown by FIGS. 5A and 5B, circular pixel array 500 can be used to model the RC behavior of pixel arrays. Modeling the pixel array as circular (e.g., rather than as square or rectangular) can allow for symmetry that simplifies the model, while still providing results that can be applied to rectangular and square pixel array and the like. Pixel array 500 has a radius of length "r." The current in pixel array 500 can travel from the center of the pixel array to the outer edges, as illustrated by directions 502. A differential slice 510 of pixel array 500 can be considered for the RC modeling, where slice 510 has a differential radius of length "dr." As shown by FIG. 5B, when slice 510 is modeled as having an actual thickness, slice 510 can have an inner radius of length "a" and an outer radius of length "b." Pixel array 500 also has a height "h" (not shown) that corresponds to the effective thickness of the n-tub iso's (e.g., n-tub iso 370 of FIG. 3) implant. For example, such an n-tub iso could be formed by implanting boron, or any other suitable p-type implant. In this case, the height "h" can correspond to the thickness of the implant, such as the distance from the bottom edge of the photodiode to the boundary between the n-tub iso and the n-tub region (e.g., the boundary between n-tub iso 370 and n-tub 350). This disclosure may discuss herein a "boron implant" with regards to an n-tub iso. However, this is for illustration and not for limitation, and one skilled in the art should appreciate that any other suitable p-type implant could alternatively or additionally be used.

Pixel array 500 can have a particular resistance to ground, where this resistance changes based on a function of distance from the center of pixel array 500. To model this changing resistance, differential slice 510 can be considered. Differential slice 510 has a resistance, "dR," which can be defined by the equation:

$$dR = \frac{\rho}{2 \cdot \pi \cdot r \cdot h} dr \qquad 1$$

where the resistivity, ρ, can vary inversely based upon the dose of the boron implant (e.g., or other suitable p-type implant).

For a slice of actual thickness (e.g., as shown by FIG. 5B), the resistance can be calculated from the inner radius, a, to the outer radius, b, as an integral of dR. For example, the resistance of such a slice can be defined by the equation:

$$R_{Slice} = \int_a^b dR = \left(\frac{\rho}{2 \cdot \pi \cdot h} \ln \frac{b}{a}\right) \qquad 2$$

Moreover, the capacitance of differential slice 510 can be proportional to the area of the slice. For example, the capacitance of such a slice can be defined by:

$$C_{Slice} = (b^2 - a^2) \cdot \pi \cdot C_{iso} \qquad 3$$

where $C_{iso}$ is the capacitance per unit area of the n-tub iso layer (e.g., n-tub iso layer 370). Generally, $C_{iso}$ can moreover include the capacitance of the n-tub iso-n-tub junction.

Equation (1) indicates that the resistance of a differential slice of the pixel array is inversely proportional to the distance from the center of the pixel array. In other words, the resistance of the pixel array is greatest in the center, and the value of the resistance becomes smaller as the distance from the center increases. Moreover, although equation (1) suggests an infinite amount of resistance in the center of array, in operation the current can travel a parallel path through the un-doped epi-layer in addition to traveling through pixel array. Accordingly, this additional current path can result in an upper bound on the resistance experienced by the body of the transistors of the pixel cells, and thus results in a non-infinite resistance in the center of pixel array 510.

In contrast to the resistance, which is inversely proportional to the distance from the center, equation (3) indicates that the capacitance is directly proportional to the distance from the center of the pixel array. In particular, the capacitance is directly proportional to the square of the distance from the center. In other words, the capacitance is smallest in the center of the array, and increases rapidly as the distance from the center of the pixel array increases.

As mentioned above, RC modeling can be used to find a solution to the black hole artifact. Accordingly, in order to model the RC behavior of pixel arrays, equations (2) and (3) can be used to solve for the resistance and capacitance values, respectively, of a pixel array. As an illustration, pixel array 500 of FIG. 5A can be divided into 9 slices of equal radial width (e.g., or into any other suitable number of slices, where a greater number of slices can provide more data points). Equations (2) and (3) can then be used to calculate a resistance and a capacitance value of each slice of pixel array 500. In other words, pixel array 500 can be modeled as a series RC network, such as series RC network 600 of FIG. 6A. FIG. 6B shows illustrative graph 610 simulating the behavior of series RC network 600. In graph 610, x-axis 612 corresponds to time (e.g., in nanoseconds) and the y-axis 614 corresponds to voltage. Each of the lines plotted in graph 610 can correspond to a different RC circuit of FIG. 6A (e.g., and thus can correspond to a different slice of a circular pixel array). As shown by graph 610, each slice can take a different amount of time to settle to a constant voltage value. In other words, based on its distance from the center of the pixel array, each slice can have a different RC time constant.

Figure 6A:
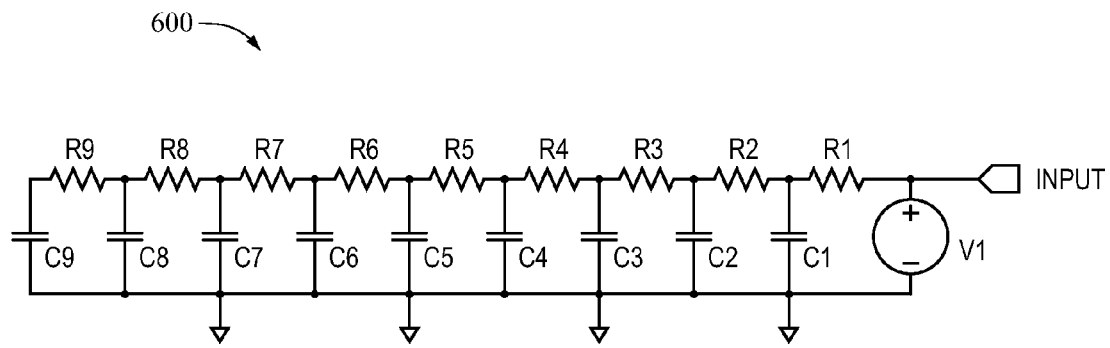
FIG. 6A shows an illustrative series RC network for modeling a circular pixel array in accordance with some embodiments of the invention.
Figure 6B:
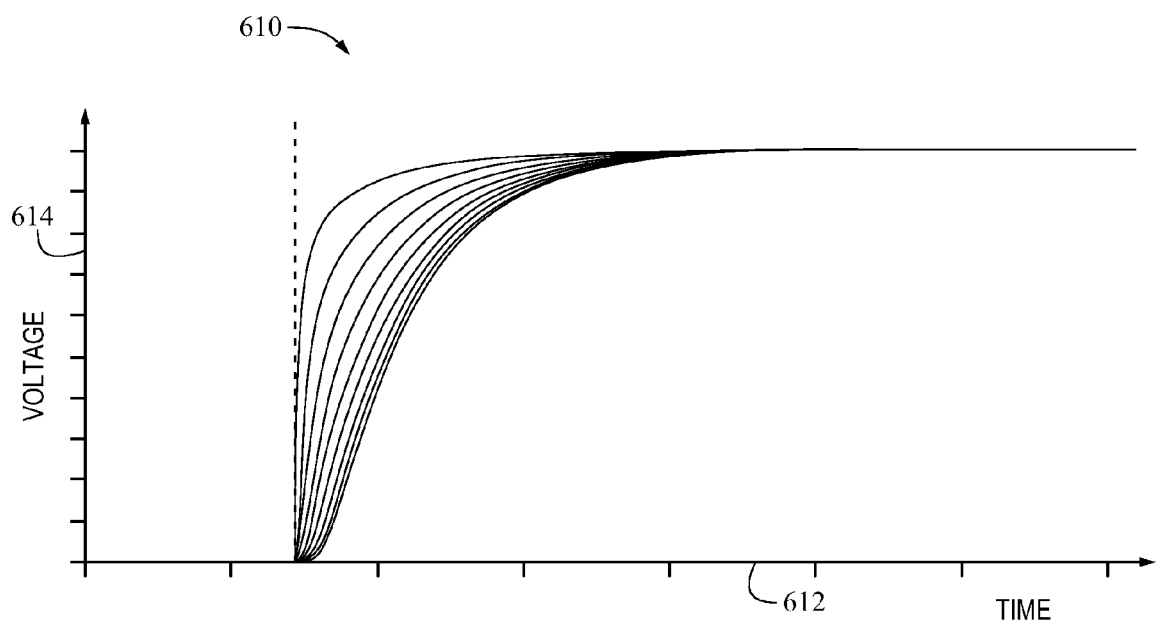
FIG. 6B shows illustrative voltage settling graphs for the RC network of FIG. 6A for various values of RC in accordance with some embodiments of the invention.

Table 1 shows illustrative RC time constants for slices of a circular pixel array that can be calculated from, for example, RC models such as those shown in FIGS. 6A and 6B.

TABLE 1

| Relative Distance From Center of Pixel Array | Slice # | Slice Resistance | Slice Capacitance | RC Time Constant |
|---|---|---|---|---|
| 15% | 9 | 0.6931 | 300 | 5.82 |
| 25% | 8 | 0.4055 | 500 | 5.63 |
| 35% | 7 | 0.2877 | 700 | 5.18 |
| 45% | 6 | 0.2231 | 900 | 4.79 |
| 55% | 5 | 0.1823 | 1100 | 4.15 |
| 65% | 4 | 0.1542 | 1300 | 3.27 |
| 75% | 3 | 0.1335 | 1500 | 2.23 |
| 85% | 2 | 0.1178 | 1700 | 1.37 |
| 95% | 1 | 0.1054 | 1900 | 0.37 |

Each row of Table 1 can correspond to results for a different slice of a circular pixel array, where each slice is positioned at a different, relative distance from the center of the pixel array. For example, a relative distance of 0% can correspond to the center of the pixel array and a relative distance of 100% can correspond to the edges of the pixel array. Accordingly, Table 1 illustrates how the RC times constant of a pixel array can vary based on the distance from the center of the pixel array. Moreover, although Table 1 was modeled from a circular pixel array, these results can be applied to square pixel array, rectangular pixel arrays, or any other suitable shape of pixel array.

Furthermore, as shown by equation (4) below, the results of Table 1 can be used to model how the dark signal of a pixel array can vary based on the position in the pixel array. Additionally, since Table 1 correlates the distance in an array to the RC time constant at that distance, Table 1 can also be used to model how the dark signal varies versus time. In particular, it can be shown that the behavior of the dark signal depends upon the amount of time a pixel array is allowed to settle. For example, the dark signal behavior (least significant bit) versus time can be defined by:

$$DarkSignal(LSB) = 42 - K\_bh \cdot e^{\frac{-t}{RC}} \quad \quad 4$$

where t is time, RC is the RC time constant, K_bh is the magnitude of the disturbance of the transistor's body at the time t=0, and 42 is a typical digital dark signal offset target.

Thus, equation (4) indicates how the dark signal of a pixel array varies based on the amount of time that the pixel array is allowed to settle (e.g., which in turn is the amount of time that the body of the source follower transistors of the pixel cells are allowed to settle). Moreover, simulations such as those shown by FIGS. 6A, 6B, and Table 1 can indicate how the RC time constant changes with regards to position in a pixel array. Based on this information, profiles of the black hole artifact of a pixel array can be modeled at various points in time. For example, FIG. 7 shows graph 700 of predicted black hole profiles for varying amounts of allowed settling times.

Figure 7:
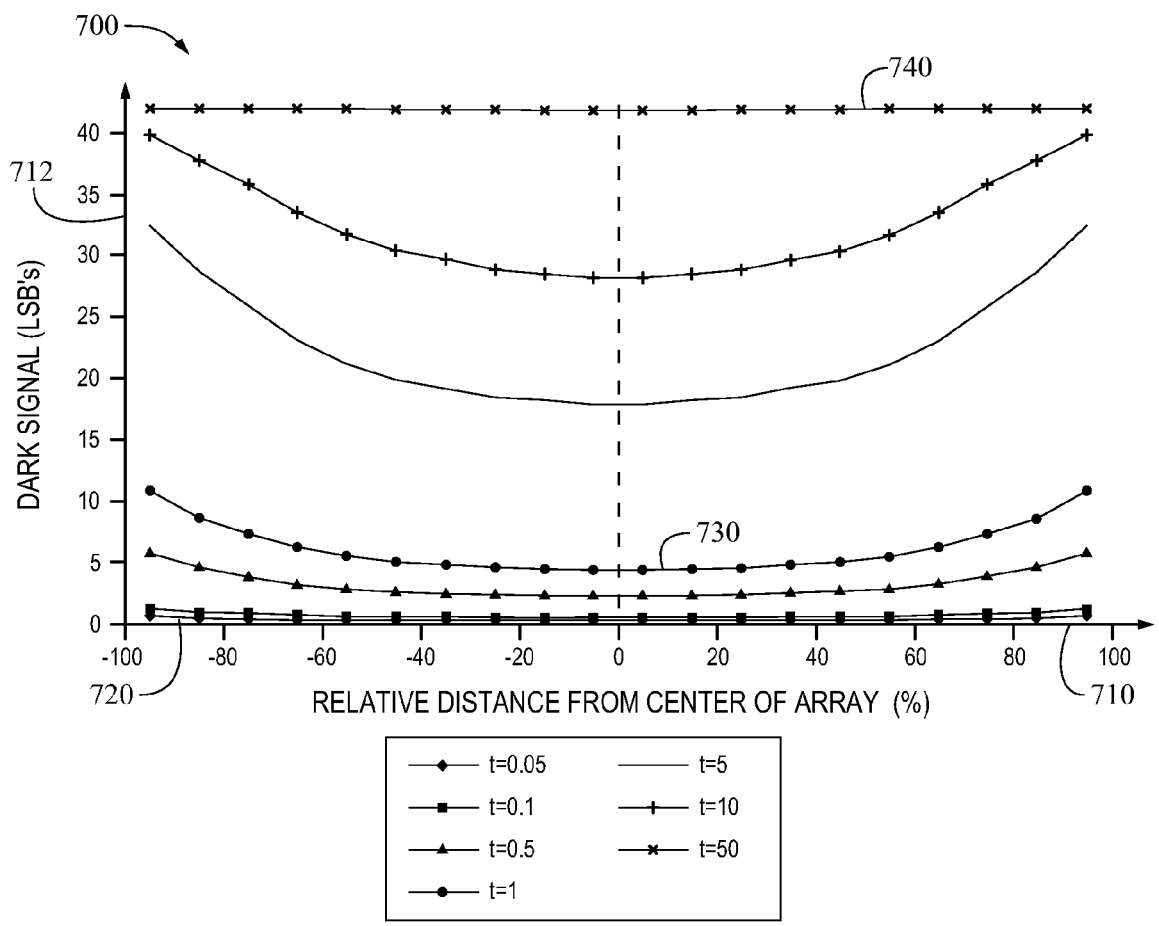
FIG. 7 shows an illustrative black hole profiles in accordance with some embodiments of the invention.

In FIG. 7, x-axis 710 can indicate the relative distance from the center of the pixel array and y-axis 712 can indicate the value of the dark signal. In other words, the center of the graph at x=0 can represent the center of a pixel array, and x=±100 can indicate the edges of a pixel array. Each of the plotted lines of graph 700 can indicate a different black hole profile, where each black hole profile corresponds to the pixel array being allowed to settle for a particular period of time. For example, black hole profile 720 can correspond to t=0.05 nanoseconds (e.g., when the pixel array has been allowed to settle for 0.05 nanoseconds), black hole profile 730 can correspond to t=1 nanosecond (e.g., when the pixel array has been allowed to settle for 1 nanosecond), black hole profile 740 can correspond to t=50 nanoseconds (e.g., when the pixel array has been allowed to settle for 50 nanoseconds), and the like.

As mentioned above, the black hole artifact is caused by a non-uniform dark signal across the pixel array. For example, black hole profile 730 illustrates this artifact by showing that different location of the pixel array exhibit different dark signals at the same point in time. However, FIG. 7 also indicates that there are two situations which can solve this black hole artifact and result in a uniform dark signal. For example black hole profile 740 (e.g., when the pixel array has been allowed to settle for 50 nanoseconds) and black hole profile 720 (e.g., when the pixel array has been allowed to settle for 0.05 nanoseconds) both indicate a uniform, flat dark signal across the pixel array. In other words, the black hole artifact can be eliminated when either the pixel array has been allowed to settle for a relatively long amount of time or when the pixel array has been allowed to settle for a relatively short amount of time. In particular, as described above, this "settling" is related to the body of the source follower transistor (e.g., source follower transistor 208 of FIG. 2) of the pixel cells being allowed to settle. Accordingly, the black hole artifact can be eliminated by:

Solution A: Increasing the relative amount the body is allowed to settle

Solution B: Decreasing the relative amount the body is allowed to settle

In other words, Solution A indicates that a pixel array should be allowed to settle a relatively long amount of time compared to how long the pixel array requires to settle to a constant value. As an illustration, if a pixel array requires 30 nanoseconds to settle to a constant value, then a "relatively long amount of time" can include, for example, 29.9 nanoseconds (e.g., or any other amount of time such that the pixel array substantially settles to a constant value). Thus, to achieve Solution A, one can either decrease the time required for the pixel array to settle to a constant value (e.g., by creating an n-tub iso with a higher boron implant) and/or increase the amount of time the pixel array is allowed to settle (e.g., by increasing the CDS period).

Similarly, Solution B indicates that a pixel array should experience an insubstantial amount of settling by allowing the pixel array to only settle for a relatively short amount of time. As an illustration, if a pixel array requires 30 nanoseconds to settle to a constant value, then a "relatively short amount of time" can include, for example, 0.05 nanoseconds (e.g., or any other amount of time such that the pixel array experiences a minimal or insignificant amount of settling). Thus, to achieve Solution B, one can, for example, increase the pixel array's resistance to ground such that an insignificant amount of settling occurs during the desired time period. In some embodiments, Solution B can provide a more desirable remedy than Solution A. For example, Solution A can require a large boron implant, which can result in a larger amount of boron diffusing into the pixel array's photodiode, thereby shrinking the photodiode area. As another example, Solution A can require a longer CDS period, thus resulting in a system that runs more slowly and requires longer processing times. Solution B, on the other hand, can be achieved by simply increasing the pixel array's resistance to ground.

The results of solution A and B are both supported by considering extreme cases of equation (4). For example, as described by an extreme case of Solution A, when all of the pixels in the array are allowed to settle for an infinite amount of time, each pixel cell can settle to the same value, despite any reliance of the RC time constant on position in the pixel array. As another example, as described by an extreme case of Solution B, when equation (4) is solved for t≈0, the dark signal becomes:

$$\text{DarkSignal}(LSB) = 42 - K\_bh \cdot e^0 = 42 - K\_bh \quad 5$$

Accordingly, as shown by equation (5), when a pixel array is allowed to settle for a substantially insignificant amount of time (e.g., Solution B), then the dark signal is constant regardless of position in the array. However, in order for equation (5) to result in a uniform dark signal, then the value of K_bh should be relatively constant across the pixel array.

Figure 8A:
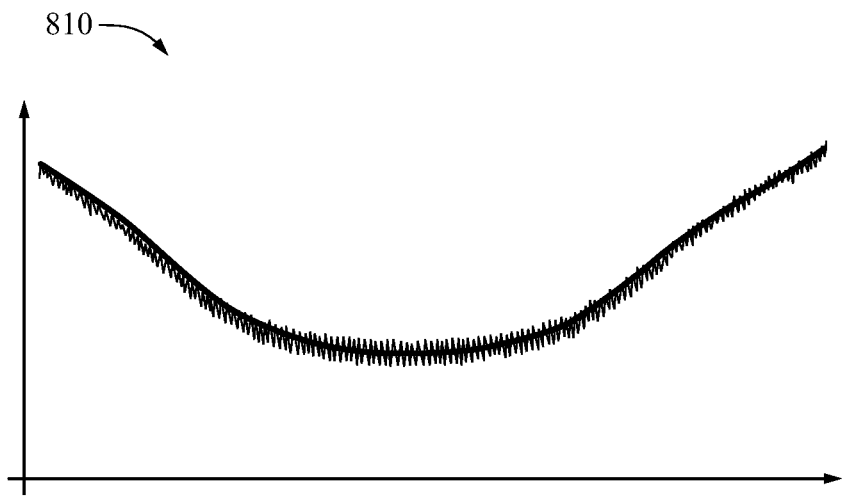
FIGS. 8A and B show an illustrative black holes profiles with adjusted pixel timings in accordance with some embodiments of the invention.
Figure 8B:
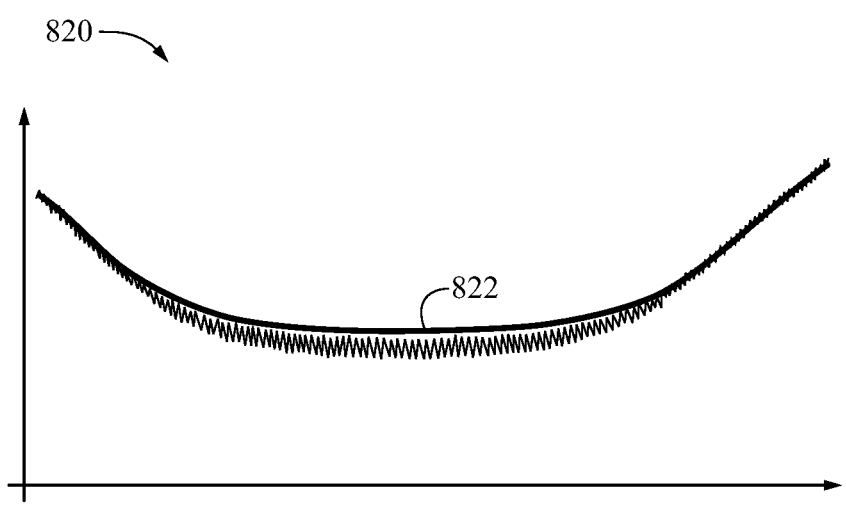

As mentioned above, K_bh is the magnitude of the disturbance of the transistor's body at the time t=0, and K_bh can correspond to the capacitive coupling from the floating diffusion (e.g., floating diffusion node B of FIG. 2) or the output of the pixel cell to the body. Moreover, FIGS. 8A and 8B show experimental results indicating that K_bh is not position dependent. For example, graph 810 shows a black hole profile for a first pixel timing. The results of graph 810 are similar to the predicted black hole profile of t=5 nanoseconds of FIG. 7. Graph 820 shows a black hole profile for a second, adjusted pixel timing. The results of graph 820 are similar to the predicted black hole profile of t=1 nanosecond of FIG. 7, thus indicating that the flatter, center region 822 of graph 820 is approaching the value of "42−K_bh" (e.g., of equation (4)). Accordingly, because graph 820 approaches a flat line in center region 822 as the pixel timing is adjusted, this can highly imply that that value of K_bh is not position dependent.

In other words, as described by Solution B above, the black hole artifact can be removed by increasing the time required for body settling to occur such that an insubstantial amount of body settling occurs during the desired time period. In an imaging system, the black hole artifact should not occur during the CDS period (e.g., when the $V_{RST}$ and $V_{SIG}$ signals are procured). In other words, for an imaging system, this "desired time period" can include the CDS period. The time required for body settling to occur can be increased by increasing the resistance from the pixel array to ground. Thus, by greatly increasing the pixel-to-ground resistance during the CDS period of a pixel array, a uniform dark signal can be achieved and the black hole artifact can be removed from the imaging system.

However, although increasing the pixel-to-ground resistance during the CDS period can remove the black hole artifact, the pixel-to-ground resistance can be decreased during the analog-to-digital conversion ("ADC") readout period. The ADC readout period can refer to when the voltage signals provided by a pixel cell (e.g., $V_{RST}$ and $V_{SIG}$) are converted from analog signals to digital signals by, for example, an image processing system coupled to the pixel array. Generally, an imaging system may only have a single analog-to-digital converter to perform this conversion. Thus, during the readout of a row of pixel cells of the pixel array, a single analog-to-digital converter may need to perform the digital conversions for the entire row of pixel cells. Since larger pixel arrays can commonly include a large number of pixel cells per row, this analog-to-digital conversion of the entire row can require a substantial amount of time (e.g., where the amount of time is referred to as "row time"). Thus, during this ADC readout period, the pixel array can be suitably grounded to ensure there is no drifting of the ground reference level during the ADC readout period, as such drifting can cause image artifacts. For example, the pixel array can be suitably grounded by coupling the pixel array to ground through a relatively small impedance.

Figure 9:
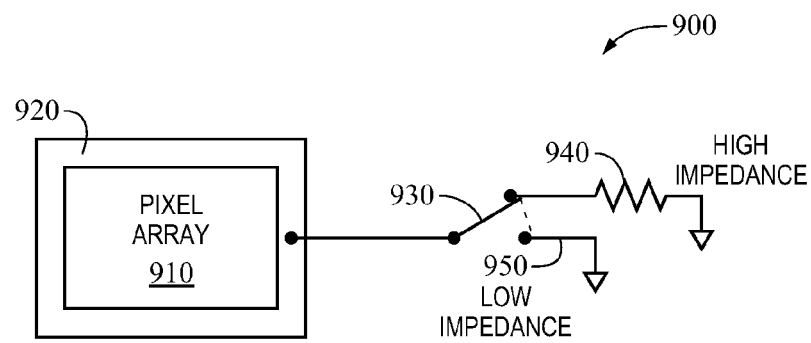
FIG. 9 shows a schematic view of a pixel array including switchable impedance in accordance with some embodiments of the invention.

FIG. 9 shows an illustrative schematic view of system 900 for grounding a pixel array during an ADC readout period yet providing a high resistance to ground during a CDS period. System 900 can include pixel array 910 surrounded by ground ring 920. Pixel array 910 may, for example, correspond to pixel array 110 of FIG. 1. However, rather than being solely or directly coupled to ground, ground ring 920 can be coupled to switch 930. Switch 930 can be operable to selectively couple ground ring 920 to either high impedance 940 or low impedance 950. For example, high impedance 940 can correspond to a value of 400 ohms, 500 ohms, 600 ohms, a resistance greater than 400 ohms, or any other suitable high impedance value. In particular, the value of high impedance 940 can depend on values such as the size of pixel array 910, size of the photodiode, the image processing being performed, the length of the CDS period, and the like and can include any suitably high value such that insignificant body settling occurs during the CDS period. As another example, low impedance value 950 can correspond to 1 ohm, 10 ohms, a resistance value between 1 and 10 ohms, a resistance value less than 20 ohms, or any other suitably low impedance value. In particular, low impedance value 950 can be any suitably low value for allowing ground ring 920 to settle at the ground reference value, without drift, during the ADC readout period.

During operation of system 900, switch 930 may couple ground ring 920 to high impedance value 940 during a CDS period. This may, for example, result in a high pixel-to-ground resistance for pixel array 910, thus increasing the body settling time of the source follower transistors of the pixel cells of pixel array 910. High impedance value 940 can be a suitably high enough resistance value such that the body settling time is significantly increased, and insubstantial body settling occurs during the signal readout periods. This, in turn, can result in the dark signal of pixel array 910 being uniform, thereby eliminating the black hole artifact from system 900.

During the ADC readout period, however, switch 930 can couple ground ring 920 to low impedance value 950. Low impedance value 950 can be a suitably low resistance value such that ground ring 920 (e.g., and therefore pixel array 910) is held to ground. This can result in eliminating any drifting of the ground reference level during the ADC readout period.

Figure 10:
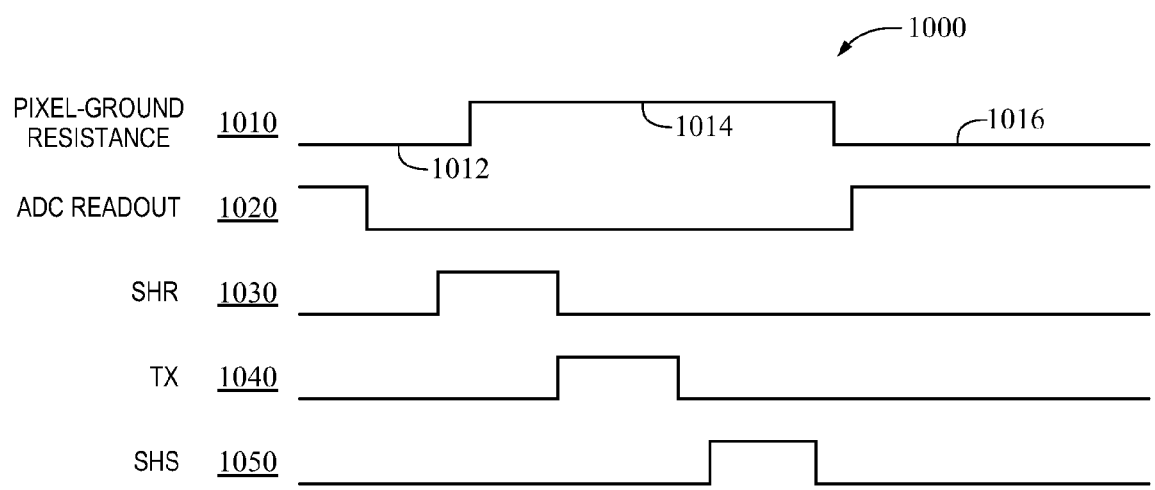
FIG. 10 shows an illustrative timing diagram for a pixel array including switchable impedance in accordance with some embodiments of the invention.

FIG. 10 shows timing diagram 1000 for the operation of a switchable impedance to ground, such as the switchable impedance illustrated by system 900 of FIG. 9. Timing diagram 1000 includes Pixel-to-Ground Resistance 1010, ADC Readout 1020, SHR 1030, TX 1040, and SHS 1050. ADC Readout 1020 can control when a system performs the ADC readout process (e.g., when signals from pixel cells of a row are converted from analog to digital). For example, the ADC Readout 1020 signal can be asserted (e.g., go to logic high) when the ADC readout process is performed. SHR 1030 can correspond to a signal for controlling the sampling and holding of a reference signal of a pixel cell (e.g., $V_{RST}$). TX 1040 can correspond to a signal for controlling a transfer resistor (e.g., transfer resistor 204 of FIG. 2) for coupling a light sensitive element (e.g., light sensitive element 202 of FIG. 2) to a floating diffusion region (e.g., floating diffusion node B of FIG. 2). SHS 1050 can correspond to a signal for controlling the sampling and holding of a signal voltage of a pixel cell (e.g., $V_{SIG}$). In other words, the CDS period can correspond to the process of enabling SHR 1030, followed by enabling TX 1040, followed by enabling SHS 1050. To operate the switchable impedance, Pixel-to-Ground Resistance 1010 can be put at low impedance value 1012 and 1016 during the ADC readout period, and can be put at high impedance value 1014 during the CDS period.

In some embodiments, the Pixel-to-Ground Resistance 1010 signal is not limited to being timed exactly with the CDS and/or ADC readout periods. For example, in some embodiments, Pixel-to-Ground resistance 1010 can be switched to a low impedance shortly before or after ADC readout 1020 is asserted or shortly before or after SHS 1050 is de-asserted. Similarly, in some embodiments, Pixel-to-Ground resistance 1010 can be switched to a high impedance shortly before or after SHR 1030 is asserted or shortly before or after ADC Readout 1020 is de-asserted.

Figure 11:
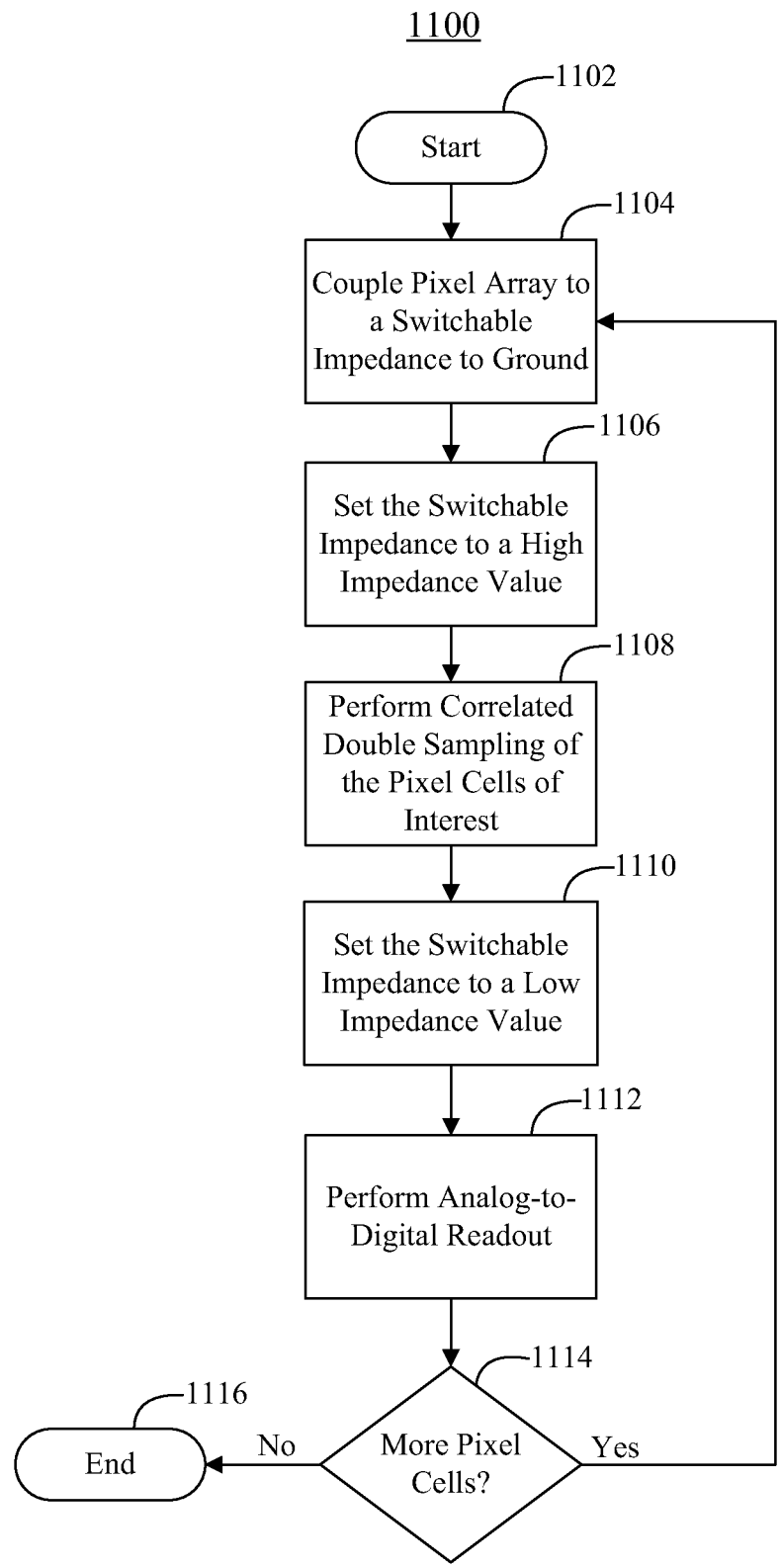
FIG. 11 shows an illustrative process for providing switchable impedance in accordance with some embodiments of the invention.

FIG. 11 shows illustrative process 1100 for providing a switchable impedance to ground. Process 1100 can start at step 1102. At step 1104, a pixel array can be coupled to a switchable impedance to ground. For example, in some embodiments a ground ring can encircle and be coupled to the pixel array (e.g., ground ring 920 of FIG. 9). The ground ring may then be coupled to a switch that can choose between a high impedance value and a low impedance value (e.g., switch 930 of FIG. 9).

At step 1106, the switchable impedance can be set to a high impedance value. For example, the high impedance can correspond to a value of 400 ohms, 500 ohms, 600 ohms, a resistance greater than 400 ohms, or any other suitable high impedance value. In particular, the value of high impedance 940 can depend on values such as the size of the pixel array, the image processing being performed, the length of a CDS period, and the like, and can include any suitably high value such that insignificant body settling occurs during a desired time period.

At step 1108, correlated double sampling ("CDS") can be performed on pixel cells of interest (e.g., while the pixel array is coupled to a high impedance value). For example, in some embodiments, an imaging system may process an entire row of pixel cells together. In this case, the "pixel cells of interest" can include the pixel cells in the row that is currently being processed. In some embodiments, the imaging system may instead process an entire column of pixel cells together and the "pixel cells of interest" can thus include the pixel cells in the column that is currently being processed. In particular, the pixel cells of interest can include any suitable one or more pixel cells of the pixel array, and are not limited to pixel cells that are physically adjacent and/or in the same row or column.

The CDS period can include the processing period during which the pixel cell's output is effectively read. For example, a reference level ($V_{REF}$) and a signal level ($V_{SIG}$) can be read from the pixel cell. An output signal can then be calculated by taking the difference of these two signals (e.g., $V_{OUT}=V_{REF}-V_{SIG}$). To determine the reference level, the value of the pixel cell can be reset by asserting a RST command signal on a reset transistor (e.g., reset transistor 206 of FIG. 2) of the pixel cell. A SHR command signal can then be asserted to cause sampling and holding of the resultant $V_{REF}$ signal. Similarly, to determine the signal level, a TX command signal can be asserted on a transfer transistor (e.g., transfer transistor 204 of FIG. 2) to couple a light-sensitive element (e.g., light sensitive element 202 of FIG. 2) to a floating diffusion region (e.g., floating diffusion node B) of the pixel cell. A SHS command signal can then be asserted to cause sampling and holding of the resultant $V_{SIG}$ signal.

At step 1110, the switchable impedance can be set to a low impedance value. In other words, the pixel array can be de-coupled from the high resistance value and instead coupled to ground. As an example, the low impedance value can correspond to 1 ohm, 10 ohms, a resistance value between 1 and 10 ohms, a resistance value less than 20 ohms, or any other suitably low impedance value. In particular, the low impedance value can be any suitably low value for allowing the pixel array (e.g., and/or a ground ring encircling the pixel array) to settle at the ground reference value, without drift, during the ADC readout period.

At step 1112, the analog-to-digital conversion ("ADC") readout period can be performed. For example, during the ADC readout period, the $V_{OUT}$ signal calculated for each pixel cell of interest at step 1108 can be converted from an analog value to a digital value. At step 1114, process 1100 can determine whether there are more pixel cells in the pixel array requiring processing. In response to there being more pixel cells, steps 1104, 1106, 1108, 1110, and 1112 can be repeated until all pixel cells of the array have been processed. For example, when the "pixel cells of interest" include a row of pixels, then every time steps 1104, 1106, 1108, 1110, and 1112 are repeated, a new row of pixels can be sampled and processed. Similarly, when the "pixel cells of interest" include a column of pixels, then every time steps 1104, 1106, 1108, 1110, and 1112 are repeated, a new column of pixels can be sampled and processed. Once again, however, the pixel cells of interests are not limited to being adjacent pixel cells and/or pixel cells in the same column or row. For example, in some embodiments, only a single pixel cell may be processed each time steps 1104, 1106, 1108, 1110, and 1112 are repeated. As another example, a plurality of non-adjacent pixel cells may be processed each time steps 1104, 1106, 1108, 1110, and 1112 are repeated, and the like.

In response to there being no more pixel cells at step 1114, process 1100 can end at step 1116.

Process 1100 discussed above is intended to be illustrative and not limiting. Persons skilled in the art can appreciate that steps of the processes discussed herein can be omitted, modified, combined, or rearranged, or that any combination of these steps or any additional steps can be performed without departing from the scope of the invention. For example, the switching of the impedance in some embodiments can occur at the same time, slightly before, or slightly after the CDS period and/or ADC readout period. As an illustration, in some embodiments step 1106 can occur during step 1108, such that the impedance is switched to high slightly after the CDS period begins. As another illustration, in some embodiments step 1106 and step 1108 can begin at the same time, such that the impedance is switched to high at the same instant the CDS period begins. Similarly, in some embodiments step 1110 can occur during step 1112 (e.g., such that the impedance is switch to low slightly after the ADC period begins) or step 1110 and step 1112 can begin at the same time (e.g., such that the impedance is switched to low at the same instant the ADC readout period begins).

Figure 12:
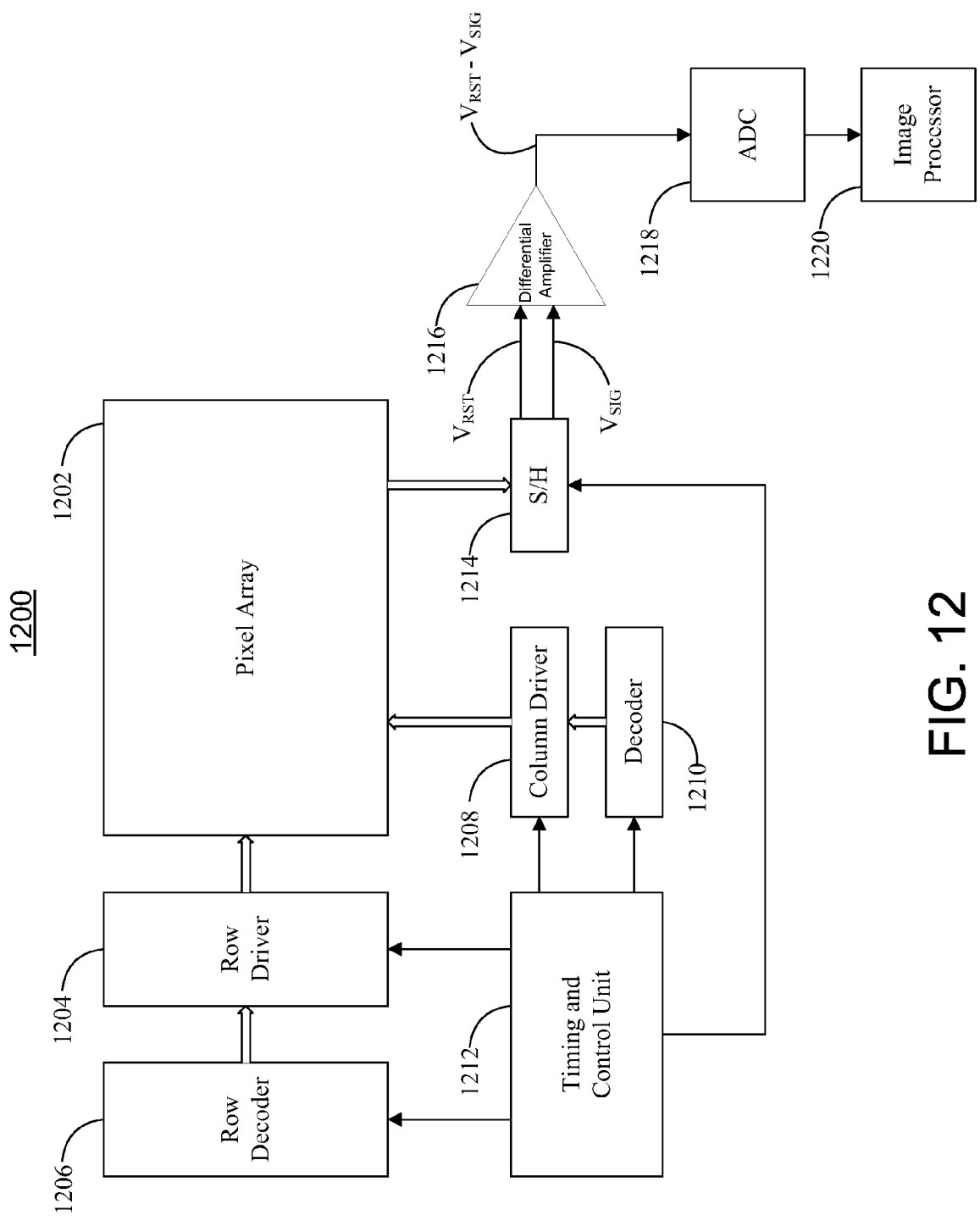
FIG. 12 shows an illustrative imaging system in accordance with some embodiments of the invention.

The systems and methods described above can be implemented in hardware, software, or in any combination of hardware and software. For example, FIG. 12 shows a schematic view of imaging system 1200 that can be used for creating pixel arrays including a switchable impedance to ground. For example, in some embodiments, imaging system 1200 could represent a CMOS imaging system.

Imaging system 1200 can have pixel array 1202 that can included pixels cells arranged in a predetermined number of columns and rows. Pixel array 1202 can be coupled to and surrounded by a ground ring, where ground ring can be coupled to a switchable impedance to ground. The switchable impedance may, for example, be operable to switch between a high impedance value and a low impedance value.

In operation, rows of pixel cells of pixel array 1202 can be selectively activated and/or read from pixel array 1202. For example, the rows can be selectively activated by row driver 1204 in response to row driver 1204 receiving a row address from row decoder 1206. Similarly, columns of pixel cells of pixel array 1202 can be selectively activated and/or read from pixel array 1202. For example, the columns can be selectively activated by column driver 1208 in response to column driver 1208 receiving a column address from column decoder 1210. Accordingly, each pixel cell of pixel array 1202 can be selectively activated and/or read from pixel array 1202 by providing the appropriate row and column address with, respectively, row decoder 1206 and column decoder 1210. Timing and control unit 1212 can instruct row decoder 1206 and column decoder 1210 to select an appropriate row and column line in order to read a particular pixel. Furthermore, timing and control unit 1212 can instruct row driver 1204 and column driver 1208 to apply an appropriate driving voltage to the drive transistors of the selected row and column lines.

Imaging system 1200 can include sampling and hold circuitry ("S/H") 1214, that can be controlled by timing and control unit 1212. As described above, during a CDS period each pixel cell of pixel array 1202 can output a reference level ("$V_{RST}$") and a signal level ("$V_{SIG}$"), which may be received by S/H 1214. For example, S/H 1214 may receive $V_{RST}$ and $V_{SIG}$ for a particular pixel cell when that pixel cell is selected by row decoder 1206 and column decoder 1210. $V_{RST}$ can represent a reset state of a pixel cell. $V_{SIG}$ can represent the amount of charge generated by the photosensor in a pixel cell in response to incident light upon the pixel cell during an integration period. S/H 1214 can sample, hold, and/or amplify $V_{RST}$ and $V_{SIG}$. For example, in some embodiments, S/H 1214 can include capacitors, where one capacitor can be used to store the $V_{RST}$ signal and one can be used to store the $V_{SIG}$ signal.

S/H 1214 may then output $V_{RST}$ and $V_{SIG}$ to differential amplifier 1216. Differential amplifier 1216 can determine the differential output signal, $V_{OUT}=V_{RST}-V_{SIG}$. This differential signal can represent, for example, the actual pixel output with common-mode noise eliminated.

The differential output signal, $V_{OUT}$, can be digitized by analog to digital converter ("ADC") 1218 (e.g., during an ADC readout period). ADC 1218 may then communicate the digitized signals to image processor 1220. Image processor 1220 can create a digital image from the digitized signals in any suitable manner and can perform any suitable image processing such as, for example, noise reduction, image dewarping, image rotations, image perspective adjustments, image panning, image tilting, imaging zooming, or any other suitable image processing.

In some embodiments, one or more of the components of imaging system 1200 can be combined or omitted. In some embodiments, imaging system 1200 can include other components not combined or included in those shown in FIG. 12, or several instances of the components shown in FIG. 12. Furthermore, although imaging device 1200 has been described with reference to a CMOS imaging system, one skilled in the art can appreciate that any suitable imaging system could be used. For example, the embodiments described herein could be used with a CCD imaging system, or any other suitable imaging system. Additionally, one skilled in the art can appreciate that the pixel cell signals (e.g., $V_{RST}$ and $V_{SIG}$) or processed pixel signals (e.g., $V_{OUT}$, the digitized signal, or any other processed signal) can alternatively be output, stored, and/or filtered in a system external to system 1200.

It will be apparent to those of ordinary skill in the art that methods involved in the invention may be embodied in a computer program product that includes a machine readable and/or usable medium. For example, such a computer usable medium may consist of a read only memory device, such as a CD ROM disk or conventional ROM device, or a random access memory, such as a hard drive device or a computer diskette, or flash memory device having a computer readable program code stored thereon.

The above described embodiments of the invention are presented for purposes of illustration and not of limitation.

What is claimed is:

1. A method for reducing artifacts of an imaging system comprising:
    configuring an imaging device of the imaging system with a switchable impedance configured to couple a ground ring of a pixel array of the imaging device to ground through the switchable impedance wherein the ground ring substantially encircles the pixel array;
    configuring the switchable impedance to selectively couple the ground ring to ground through a high impedance level in response to a correlated double sampling ("CDS") period of operation of the imaging system; and
    configuring the switchable impedance to selectively couple the ground ring to ground through a low impedance level for an analog-to-digital conversion ("ADC") period of operation of the imaging system.

2. The method of claim 1, wherein:
    the high impedance level comprises a value greater than 300 ohms; and
    the low impedance level comprises a value less than 20 ohms.

3. The method of claim 1, wherein configuring the imaging device includes configuring the pixel array comprising a plurality of pixel cells wherein each pixel cell of the plurality of pixel cells comprises a source follower transistor including a body; and
    configuring the high impedance level comprising a resistance value sufficiently high to increase a body settling time of the source follower to a value that results in a negligible settling of the body of each pixel cell during the CDS period.

4. The method of claim 1, wherein configuring the switchable impedance includes configuring the low impedance level comprising a resistance value sufficiently low such that drift of a ground reference level does not occur during the ADC period.

5. The method of claim 1, wherein configuring the switchable impedance includes configuring the switchable impedance to form the high impedance level at substantially the same time the CDS period of operation begins.

6. The method of claim 1, wherein configuring the switchable impedance includes configuring the switchable impedance to form the high impedance level during an enabling of a SHR command signal of the CDS period of operation.

7. The method of claim 1, wherein
configuring the switchable impedance includes configuring the switchable impedance to form the low impedance level before the ADC readout period begins.

8. A method of forming an imaging device, comprising:
configuring the imaging device to couple a pixel array of the imaging device to ground via a switchable impedance;
configuring the imaging device to set the switchable impedance to a high impedance value;
configuring the imaging device to generate an output signal corresponding to at least one pixel cell of the pixel array, wherein the output signal corresponds to an amount of light sensed by the at least one pixel cell, wherein the high impedance value comprises a resistance value large enough to increase a body settling time of a transistor of the at least one pixel cell of the pixel array such that an insubstantial amount of body settling occurs while generating the output signal, and wherein the high impedance value is maintained substantially throughout generating the output signal;
configuring the imaging device to set the switchable impedance to a low impedance value; and
configuring the imaging device to convert the generated output signal from an analog signal to a digital signal, wherein the low impedance value comprises a resistance value small enough to prevent drift of a ground reference value during the converting, and wherein the low impedance value is maintained substantially throughout the converting.

9. The method of claim 8, wherein the body settling comprising body settling of a source follower transistor of the at least one pixel cell.

10. The method of claim 8, wherein generating the output signal comprises:
performing correlated double sampling on the at least one pixel cell.

11. The method of claim 8, wherein generating the output value comprises:
receiving a reference level signal from the at least one pixel cell;
receiving a signal level signal from the at least one pixel cell; and
generating the output signal by subtracting the signal level signal from the reference level signal.

12. The method of claim 11, wherein receiving the reference level signal comprises:
asserting a RST command signal to turn on a reset transistor of the at least one pixel cell; and
asserting a SHR command signal to sample and hold a signal that is output by the at least one pixel cell as a result of asserting the RST command signal.

13. The method of claim 11, wherein receiving the signal level signal comprises:
asserting a TX control signal to turn on a transfer transistor of the at least one pixel cell, wherein the transfer transistor couples a light-sensing element of the at least pixel cell to a floating diffusion node of the at least one pixel cell; and
asserting a SHS command signal to sample and hold a signal that is output by the at least one pixel cell as a result of asserting the TX control signal.

14. The method of claim 8, wherein configuring the imaging device to couple the pixel array of the imaging device to ground includes configuring the imaging device to couple a ground ring that substantially encircles the pixel array to ground via the switchable impedance, and wherein the at least one pixel cell comprises a row of pixel cells of the array.

15. An imaging system comprising:
a pixel array including a plurality of pixel cells arranged in rows and columns;
a ground ring coupled to and surrounding the pixel array, the ground ring coupled to ground nodes of the pixel array; and
a switchable impedance coupling the ground ring to a ground reference level, wherein the switchable impedance:
switches to a high impedance value for a pixel cell sampling phase of the pixel array, wherein the cell sampling phase generates at least one output signal corresponding to an amount of light sensed by at least one pixel cell of the pixel array; and
switches to a low impedance value for an analog-to-digital conversion ("ADC") phase of the pixel array, wherein the ADC phase converts the at least one output signal from an analog value to a digital value.

16. The imaging system of claim 15, further comprising:
an n-tub isolation layer positioned beneath the pixel array and intersecting the ground ring, wherein:
the n-tub isolation layer causes a body settling time of each pixel cell of the plurality of pixel cells to vary based on each pixel cell's relative distance from the center of the pixel array; and
the varying of the body settling time causes a black hole artifact in the pixel array.

17. The imaging system of claim 16, wherein:
the high impedance value increases the body settling time to a value that results in an insignificant amount of body settling of each pixel cell occurs during the pixel cell sampling phase.

18. The imaging system of claim 15, further comprising:
an n-tub isolation layer positioned beneath the pixel array;
an n-tub of n-type material positioned beneath the n-tub isolation layer; and
a pixel power ring encircling the pixel array and coupled to the n-tub, wherein the pixel power ring positively biases the n-tub such that the n-tub prevents deeply generated electrons from reaching the pixel array.

19. The imaging system of claim 15, wherein the high impedance value comprises a value greater than 500 ohms, and the low impedance value comprises a value less than 10 ohms.

20. The imaging system of claim 15, wherein each pixel cell is formed to have a body settling time and wherein the high impedance value increases the body settling time to a value that results in an insignificant amount of body settling occurring for each pixel cell during a time that the pixel cell sampling phase occurs.

* * * * *